US012813269B2

(12) United States Patent
Jeon et al.

(10) Patent No.: US 12,813,269 B2
(45) Date of Patent: Nov. 24, 2026

(54) CHIP PROTECTION DEVICE

(71) Applicant: SAMSUNG ELECTRONICS CO., LTD., Suwon-si (KR)

(72) Inventors: Taejun Jeon, Suwon-si (KR); Yongkwan Lee, Suwon-si (KR); Gyuhyeong Kim, Suwon-si (KR); Seunghwan Kim, Suwon-si (KR); Jongwan Kim, Suwon-si (KR); Junwoo Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 516 days.

(21) Appl. No.: 18/453,026

(22) Filed: Aug. 21, 2023

(65) Prior Publication Data

US 2024/0096748 A1 Mar. 21, 2024

(30) Foreign Application Priority Data

Sep. 19, 2022 (KR) ........................ 10-2022-0118154

(51) Int. Cl.
*H10W 40/47* (2026.01)
*H10W 72/00* (2026.01)
(Continued)

(52) U.S. Cl.
CPC ...... *H10W 40/47* (2026.01); *H10W 72/07253* (2026.01); *H10W 72/232* (2026.01); *H10W 72/877* (2026.01); *H10W 74/15* (2026.01); *H10W 76/10* (2026.01); *H10W 76/167* (2026.01); *H10W 76/17* (2026.01); *H10W 90/724* (2026.01); *H10W 90/727* (2026.01); *H10W 90/731* (2026.01)

(58) Field of Classification Search
CPC ...................... H10W 76/167; H10W 40/40–47
See application file for complete search history.

(56) References Cited

U.S. PATENT DOCUMENTS 5,933,323 A * 8/1999 Bhatia .................. H10W 40/73 174/15.2
7,635,916 B2 12/2009 Jensen et al.
(Continued)

FOREIGN PATENT DOCUMENTS

JP H0878572 A 3/1996
JP 2009253206 A 10/2009
(Continued)

*Primary Examiner* — Tucker J Wright
(74) *Attorney, Agent, or Firm* — Wolf, Greenfield & Sacks, P.C.

(57) ABSTRACT

A chip protection device includes a protection frame extending around side surfaces of a semiconductor chip mounted on a substrate. The protection frame includes a plurality of side walls, each wall facing and spaced apart from a respective side surface of the semiconductor chip, and a plurality of upper walls, each upper wall extending inward from an upper portion of a respective side wall toward the semiconductor chip. A plurality of apertures are formed through the side walls and through which a fluid enters and exits. The protection frame defines an inner space in which the fluid can flow via the plurality of apertures. Heat from the side surfaces of the semiconductor chip is transferred to the fluid in the inner space.

20 Claims, 19 Drawing Sheets

(51) Int. Cl.

| | |
|---|---|
| *H10W 72/20* | (2026.01) |
| *H10W 74/15* | (2026.01) |
| *H10W 76/10* | (2026.01) |
| *H10W 76/12* | (2026.01) |
| *H10W 76/17* | (2026.01) |
| *H10W 90/00* | (2026.01) |

(56) References Cited

U.S. PATENT DOCUMENTS

| | | | |
|---|---|---|---|
| 7,973,400 | B2 | 7/2011 | Paek et al. |
| 8,836,110 | B2 | 9/2014 | Chopin et al. |
| 10,424,531 | B2 | 9/2019 | Bitz et al. |

FOREIGN PATENT DOCUMENTS

| | | | |
|---|---|---|---|
| KR | 20070069714 | A | 7/2007 |
| KR | 100885911 | B1 | 2/2009 |

* cited by examiner

CHIP PROTECTION DEVICE

CROSS-REFERENCE TO RELATED APPLICATION

This application claims priority under 35 U.S.C. § 119 to Korean Patent Application No. 10-2022-0118154, filed on Sep. 19, 2022, in the Korean Intellectual Property Office, the disclosure of which is incorporated by reference herein in its entirety.

BACKGROUND

The inventive concept relates generally to a chip protection device, and more particularly, to a chip protection device surrounding a semiconductor chip.

With the development of the semiconductor industry and the needs of users, electronic devices are trending toward further miniaturization and weight reduction. Semiconductors, which are used as parts of electronic devices, are also trending toward miniaturization and weight reduction. In order to improve the reliability of a semiconductor, it may be necessary to protect the semiconductor and simultaneously dissipate heat from the semiconductor.

SUMMARY

The inventive concept provides a chip protection device capable of protecting a semiconductor chip and simultaneously improving a heat dissipation characteristic of the semiconductor chip.

The problem to be solved by the inventive concept is not limited to the above-mentioned problem, and other problems not mentioned will be clearly understood by those skilled in the art from the following description.

According to an aspect of the inventive concept, there is provided a chip protection device including a protection frame extending around side surfaces of a semiconductor chip mounted on a substrate. The protection frame includes a plurality of side walls, each side wall facing and spaced apart from a respective side surface of the semiconductor chip, and a plurality of upper walls, each upper wall extending inward from an upper portion of a respective one of the plurality of side walls toward the semiconductor chip. A plurality of apertures are formed through at least some of the side walls surfaces and through which a fluid enters and exits. The plurality of side walls and the upper walls define an inner space through which the fluid can flow via the apertures. Heat from at least some of the side surfaces of the semiconductor chip is transferred to the fluid in the inner space.

According to another aspect of the inventive concept, there is provided a chip protection device including a protection frame extending around side surfaces of a semiconductor chip mounted on a substrate. The protection frame includes a plurality of side walls, each side wall facing and spaced apart from a respective side surface of the semiconductor chip, a plurality of upper walls, each upper wall extending inward from an upper portion of a respective one of the side walls toward the semiconductor chip, and a plurality of lower walls, each lower wall extending inward from a lower portion of a respective one of the side walls toward the semiconductor chip. A plurality of apertures are formed through at least some of the side walls. The plurality of side walls, the plurality of upper walls, and the plurality of lower walls define an inner space through which a fluid can flow via the apertures. A portion of at least one of the plurality of upper walls contacts a respective side surface of the semiconductor chip, and a portion of at least one of the plurality of lower walls contacts a respective side surface of the semiconductor chip. Heat from at least some of the side surfaces of the semiconductor chip is transferred to the fluid in the inner space.

According to another aspect of the inventive concept, there is provided a chip protection device including a protection frame extending around side surfaces of a semiconductor chip mounted on a substrate. The protection frame includes a plurality of side walls, each side wall facing and spaced apart from a respective side surface of the semiconductor chip, a plurality of upper walls, each upper wall extending inward from an upper portion of a respective one of the side walls toward the semiconductor chip, and a plurality of lower walls, each lower wall extending inward from a lower portion of a respective one of the plurality of side walls toward the semiconductor chip. A plurality of apertures are formed through at least some of the side walls and are aligned horizontally and vertically. The plurality of side walls, the plurality of upper walls, and the plurality of lower walls define an inner space through which a fluid can flow via the plurality of apertures. A portion of at least one of the side walls contacts a respective side surface of the semiconductor chip, and a portion of at least one of the lower walls contacts a respective side surface of the semiconductor chip. Heat from at least some of the side surfaces of the semiconductor chip is transferred to the fluid in the inner space.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
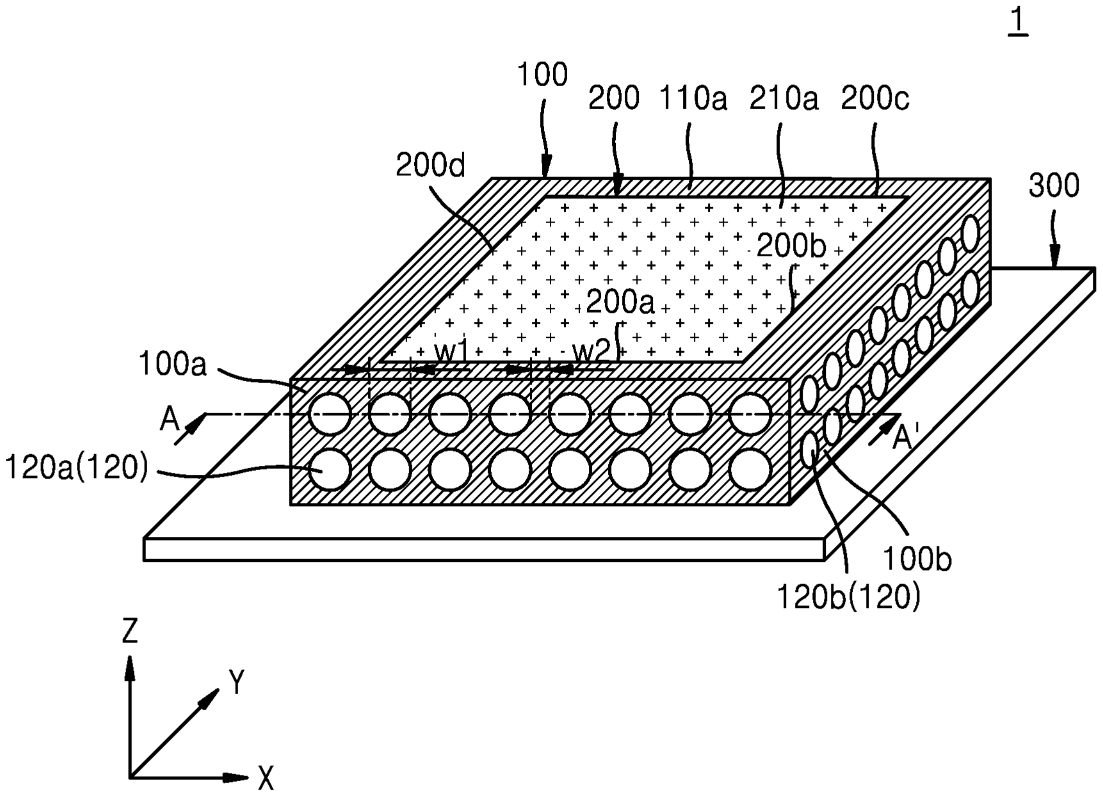
FIG. 1 is a perspective view illustrating a chip protection device according to an embodiment.

Hereinafter, embodiments of the present disclosure will be described in detail with reference to the accompanying drawings. The same reference numerals are used for the same components in the drawings, and redundant descriptions thereof are omitted.

Figure 2A:
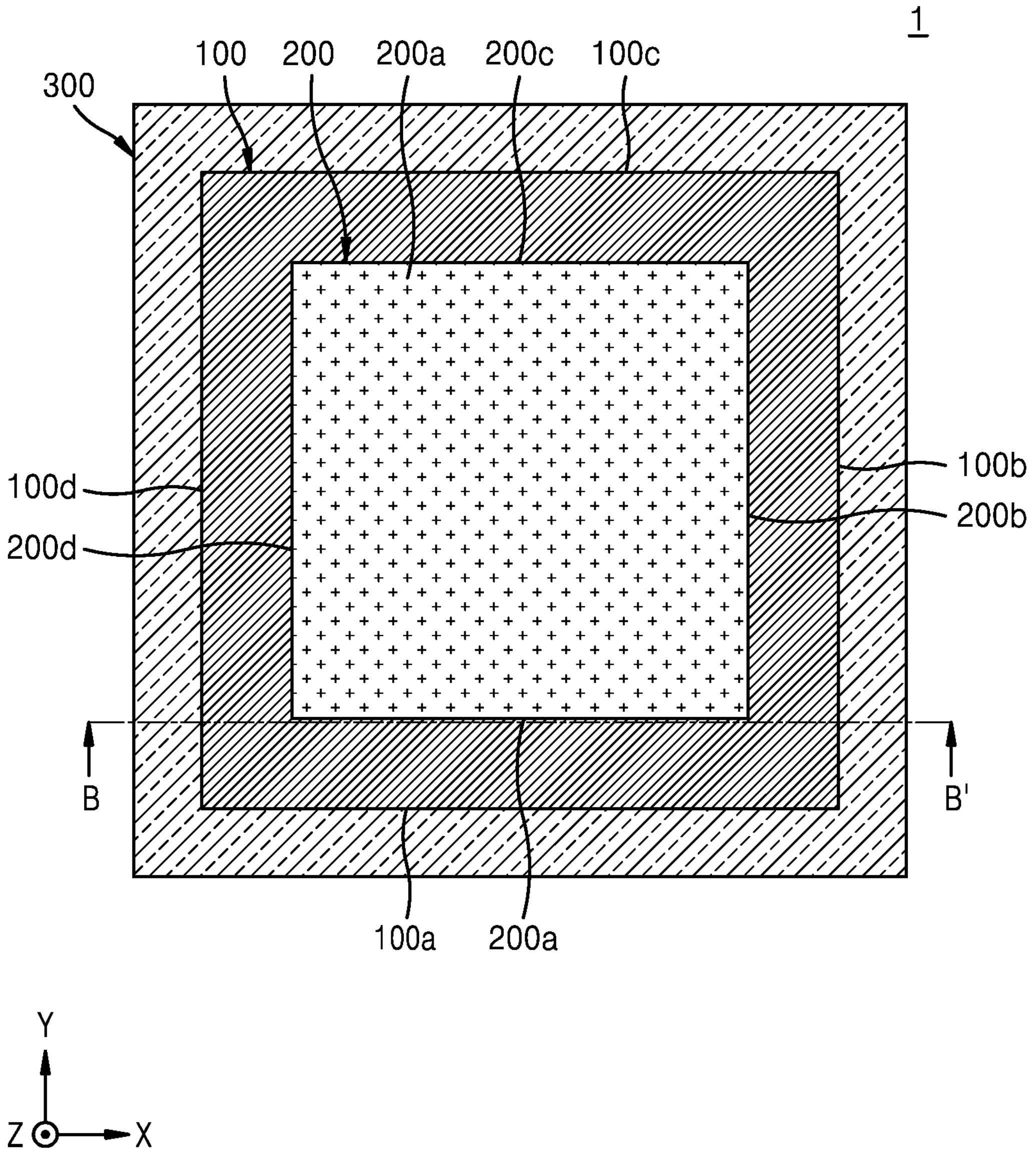
FIG. 2A is a top plan view illustrating a chip protection device according to an embodiment.
Figure 2B:
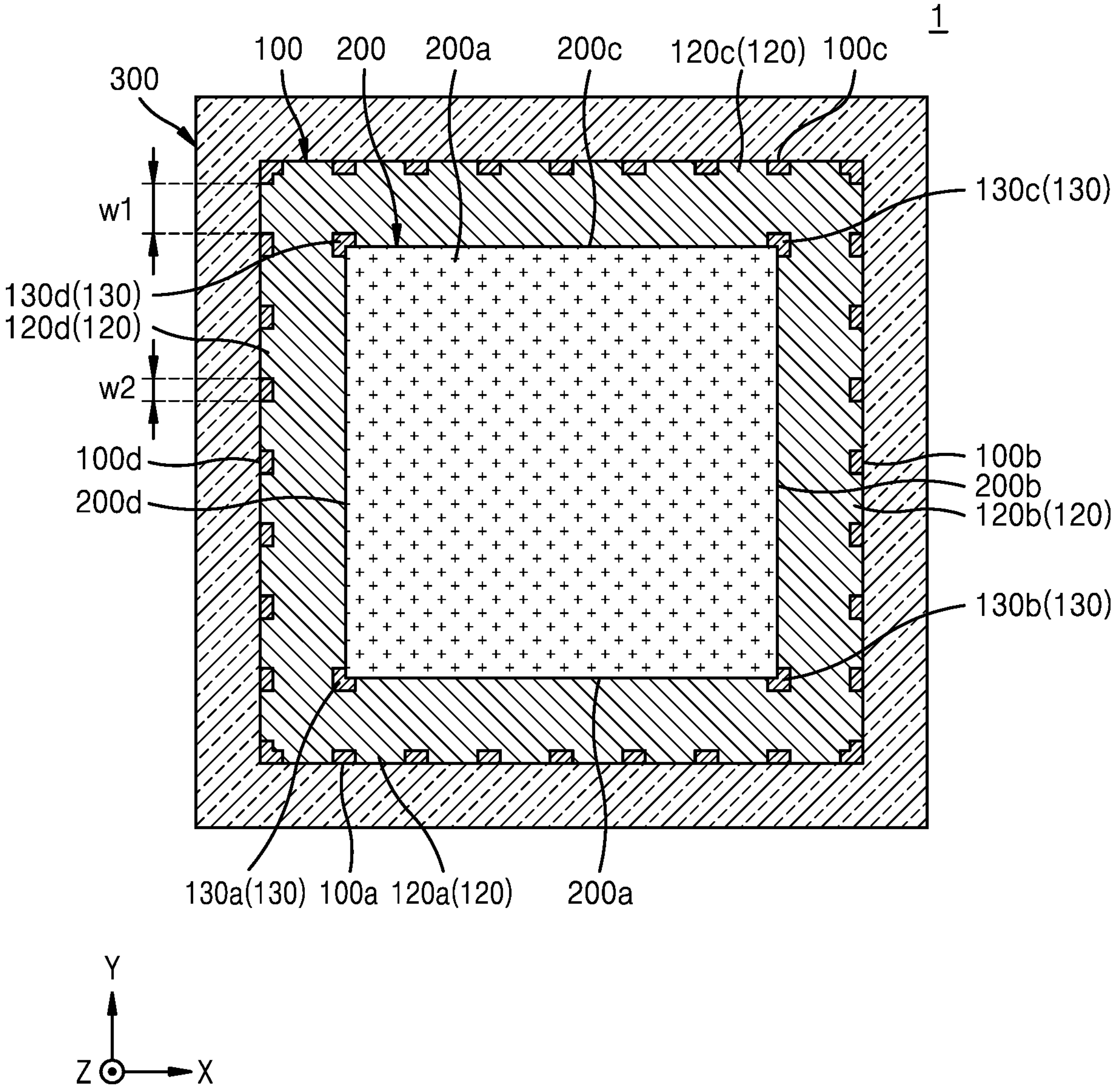
FIG. 2B is a cross-sectional view illustrating a chip protection device according to an embodiment taken from a line A-A' of FIG. 1.

FIG. 1 is a perspective view illustrating a chip protection device 1 according to an embodiment. FIG. 2A is a top plan view illustrating the chip protection device 1 according to an embodiment. FIG. 2B is a cross-sectional view illustrating the chip protection device 1 according to an embodiment taken from a line A-A' of FIG. 1.

Referring to FIGS. 1, 2A, and 2B, semiconductor chips 200 may be mounted on an upper surface of a substrate 300 and electrically connected to each other.

As an embodiment, the semiconductor chip 200 may have a hexahedral shape. Therefore, side surfaces of the semiconductor chip 200 may be formed in a quadrangular shape. The semiconductor chip 200 may include first to fourth side surfaces 200*a*, 200*b*, 200*c*, and 200*d*. The side surfaces of the semiconductor chip 200 may include the first side surface 200*a*, which is one side surface of the semiconductor chip 200, the second side surface 200*b* forming a corner with the first side surface 200*a* and forming another side surface at a specific angle, the third side surface 200*c* forming a corner with the second side surface 200*b* and forming another side surface at a specific angle, and the fourth side surface 200*d* formed in the same manner as above and forming a corner by meeting each of the first side surface 200*a* and the third side surface 200*c*. The semiconductor chip 200 may include an upper surface 210*a* and a lower surface (not shown).

The semiconductor chip 200 may be a memory chip. As an embodiment, the semiconductor chip 200 may include a volatile memory chip and/or a non-volatile memory chip. The volatile memory chip may include, for example, dynamic random access memory (DRAM), high bandwidth memory (HBM) DRAM, static RAM (SRAM), thyristor RAM (TRAM), zero capacitor RAM (ZRAM), or twin transistor RAM (TTRAM). In addition, the non-volatile memory chip may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, or insulator resistance change memory.

As an embodiment, the semiconductor chip 200 may be a logic chip. For example, the semiconductor chip 200 may be implemented as a central processing unit (CPU), a graphics processing unit (GPU), an application processor (AP), a neural processing unit (NPU) or system on chip (System on Chip), etc., but is not limited thereto.

As an embodiment, the semiconductor chip 200 may be a communication chip. The semiconductor chip 200 may include a signal processing circuit for processing a radio signal, and may include a radio-frequency integrated circuit (RFIC).

The semiconductor chip 200 may be electrically connected to the substrate 300 while being mounted on the upper surface of the substrate 300. The substrate 300 may be a printed circuit board (PCB). For example, the substrate 300 may be a multi-layer printed circuit board (PCB). A substrate layer constituting the substrate 300 may include at least one material of phenol resin, epoxy resin, or polyimide. The substrate layer may include at least one of, for example, frame retardant 4 (FR4), tetrafunctional epoxy, polyphenylene ether, epoxy/polyphenylene oxide, bismaleimide triazine (BT), Thermount, cyanate ester, polyimide, or liquid crystal polymer. Alternatively, the substrate 300 may be an interposer.

The chip protection device 1 includes a protection block or frame 100 having a plurality of holes or apertures 120. The protection frame 100 has a ring shape along the circumferences of the first to fourth side surfaces 200*a*, 200*b*, 200*c*, and 200*d* of the semiconductor chip 200. When observed on the X-Y plane (i.e., in plan view), the protection frame 100 may have a rectangular ring shape, and an inner part thereof corresponding to the shape of the semiconductor chip 200 may have an empty shape (i.e., the protection frame 100 has a rectangular configuration with an inner opening that receives the semiconductor chip 200 such that the protection frame 100 extends around the outer perimeter of the semiconductor chip 200).

The protection frame 100 may include first to fourth side walls 100*a*, 100*b*, 100*c*, and 100*d*. As an embodiment, each of the first to fourth side walls 100*a*, 100*b*, 100*c*, and 100*d* may have a quadrangular shape. The protection frame 100 may include the first side wall 100*a*, which is one of the first to fourth side walls 100*a*, 100*b*, 100*c*, and 100*d*, the second side wall 100*b* forming a corner with the first side wall 100*a* at a specific angle, the third side wall 100*c* forming a corner with the second side wall 100*b* at a specific angle, and the fourth side wall 100*d* formed in the same manner as above and forming a corner by meeting each of the first side wall 100*a* and the third side wall 100*c*.

The protection frame 100 may include upper walls 110*a* extending inward from an upper portion of each respective side wall 100*a*, 100*b*, 100*c*, 100*d*, as illustrated. The upper walls 110*a* may form a corner by meeting each of the first to fourth side walls 100*a*, 100*b*, 100*c*, and 100*d* of the protection frame 100, and are configured to be parallel to the X-Y plane (i.e., are co-planar). As an embodiment, the upper walls 110*a* of the protection frame 100 may be included on the same plane as the upper surface 210*a* of the semiconductor chip 200. In other words, the upper surface 210*a* of the semiconductor chip 200 and the upper walls 110*a* of the protection frame 100 may have the same height in the Z-axis direction (i.e., are co-planar). When the height is the same, the protection frame 100 may be protected by the chip protection device 1, and at the same time, the upper surface 210*a* of the semiconductor chip 200 may be exposed, and thus, heat dissipation of the semiconductor chip 200 may be facilitated.

A plurality of apertures 120*a*, 120*b*, 120*c*, and 120*d* may be respectively formed through the first to fourth side walls 100*a*, 100*b*, 100*c*, and 100*d* of the protection frame 100. A plurality of first apertures 120*a* may be formed in the first side wall 100*a*. Similarly, a plurality of second apertures 120*b* may be formed in the second side wall 100*b*, a plurality of third apertures 120*c* may be formed in the third side wall 100*c*, and a plurality of fourth apertures 120*d* may be formed in the fourth side wall 100*d*.

The plurality of apertures 120*a*, 120*b*, 120*c*, and 120*d* may be randomly distributed in or aligned horizontally and vertically in the first to fourth side walls 100*a*, 100*b*, 100*c*, and 100*d*, respectively. As an embodiment, as shown in FIG. 1, the plurality of first apertures 120*a* formed in the first side wall 100*a* may be continuously arranged and positioned at the same heights as apertures adjacent in the horizontal direction (X-axis direction). Similarly, the plurality of first apertures 120*a* may be continuously arranged and positioned on the same lines (i.e., rows) as apertures adjacent in the vertical direction (Z-axis direction). The plurality of second apertures 120*b* formed in the second side wall 100*b* may be continuously arranged and positioned at the same heights as apertures adjacent in the horizontal direction (Y-axis direction). Similarly, the plurality of second apertures 120*b* may be continuously arranged and positioned on the same lines (i.e., rows) as apertures adjacent in the vertical direction (Z-axis direction). The plurality of third apertures 120*c* formed in the third side wall 100*c* and the plurality of fourth apertures 120*d* formed in the fourth side wall 100*d* may be arranged in the same manner as above.

As an embodiment, as shown in FIG. 1, eight of the plurality of first apertures 120*a* positioned in the first side wall 100*a* may be continuously arranged in the X-axis direction. The adjacent eight apertures may extend the same distance in the X direction. The plurality of first apertures 120*a* positioned in the first side wall 100*a* may be arranged in two lines in the vertical direction (i.e., the first apertures 120*a* are arranged in two horizontal rows, as illustrated). All of the plurality of apertures 120 may have the same shape or size. Also, separation distances between the plurality of apertures 120 and adjacent apertures may be constant. The arrangement of the plurality of apertures 120*a*, 120*b*, 120*c*, and 120*d* and the number and shapes of the plurality of apertures 120*a*, 120*b*, 120*c*, and 120*d* are not limited by the description herein.

The plurality of apertures 120 are formed through the first to fourth side walls 100*a*, 100*b*, 100*c*, and 100*d*. The plurality of apertures 120 are formed to allow outside air to be introduced therein. An empty inner space may be formed between the first to fourth side walls 100*a*, 100*b*, 100*c*, and 100*d* and the first to fourth side surfaces 200*a*, 200*b*, 200*c*, and 200*d* of the semiconductor chip 200 facing each other. In other words, an inner space surrounded by the first to fourth side walls 100*a*, 100*b*, 100*c*, and 100*d*, the first to fourth side surfaces 200*a*, 200*b*, 200*c*, and 200*d* of the semiconductor chip 200 facing each other, and the upper walls 110*a* of the protection frame 100 may be formed.

At least some of the first to fourth side surfaces 200*a*, 200*b*, 200*c*, and 200*d* of the semiconductor chip 200 may be exposed to the inner space.

Referring to FIG. 2B, fixtures or supports 130 may be positioned between the upper walls 110*a* of the protection frame 100 and the lower walls 110*b* to be described below, may connect the upper walls 110*a* of the protection frame 100 to the lower walls 110*b* to be described below, and support the upper walls 110*a* and the first to fourth side walls 100*a*, 100*b*, 100*c*, and 100*d*. An inner space surrounded by the upper walls 110*a*, the lower walls 110*b*, and the first to fourth side walls 100*a*, 100*b*, 100*c*, and 100*d* of the protection frame 100 may be formed. A fluid entering and exiting through the plurality of apertures 120 may move in the inner space.

A first support 130*a* may be formed to cover a corner where the first side surface 200*a* and the second side surface 200*b* meet, and cover a part of the first side surface 200*a* and a part of the second side surface 200*b*. A second support 130*b* may be formed to cover a corner where the second side surface 200*b* and the third side surface 200*c* meet and cover a part of the second side surface 200*b* and a part of the third side surface 200*c*. A third support 130*c* may be formed to cover a corner where the third side surface 200*c* and the fourth side surface 200*d* meet, and cover a part of the third side surface 200*c* and a part of the fourth side surface 200*d*. A fourth support 130*d* may be formed to cover a corner where the fourth side surface 200*d* and the first side surface 200*a* meet, and cover a part of the fourth side surface 200*d* and a part of the first side surface 200*a*.

As an embodiment, the supports 130 may be configured to have a cross-section in an 'L' shape on an X-Y plane, as illustrated in FIG. 2B. Bent inner parts of the first to fourth supports 130*a*, 130*b*, 130*c*, and 130*d* in the 'L' shape may be positioned to cover corners where the first to fourth side surfaces 200*a*, 200*b*, 200*c*, and 200*d* of the semiconductor chip 200 meet each other. Bent outer parts of the first to fourth supports 130*a*, 130*b*, 130*c*, and 130*d* in the 'L' shape are exposed to the inner space.

The supports 130 may contact corner parts of the semiconductor chip 200 extending in the Z-axis direction. As an embodiment, when the semiconductor chip 200 has a rectangular shape, as shown in FIG. 2B, all of the supports 130 may be positioned on vertices of a rectangle. Alternatively, the supports 130 may be positioned on two facing vertices. In other words, the supports 130 may include the first support 130*a* and the third support 130*c* or the second support 130*b* and the fourth support 130*d*.

The supports 130 fix the position of the chip protection device 1 with respect to the semiconductor chip 200. The supports 130 may fix the position of the chip protection device 1 in the Z-axis direction with respect to the semiconductor chip 200 through an adhesive layer 310 (FIG. 3A) applied to the substrate 300 to be described below. The supports 130 included in the chip protection device 1 may contact the semiconductor chip 200 and fix the position of the semiconductor chip 200 in the X-axis and Y-axis directions with respect to the chip protection device 1. Accordingly, a three-axis position of the chip protection device 1 may be fixed with respect to the semiconductor chip 200.

The position of the chip protection device 1 may be fixed with respect to the semiconductor chip 200 in another method, as described below.

Because the plurality of apertures 120*a*, 120*b*, 120*c*, and 120*d* are respectively formed through the first to fourth side walls 100*a*, 100*b*, 100*c*, and 100*d*, the inner space is connected to each of the plurality of apertures 120*a*, 120*b*, 120*c*, and 120*d*. A width of each of the plurality of apertures 120 respectively appearing on the first to fourth side walls 100*a*, 100*b*, 100*c*, and 100*d* in the X or Y axis direction may be referred to as a first width w1 (FIG. 1). Because the plurality of apertures 120 each having the first width w1 are respectively formed through the first to fourth side walls 100*a*, 100*b*, 100*c*, and 100*d*, the first to fourth side walls 100*a*, 100*b*, 100*c*, and 100*d* are shown in a cross-section in which a plurality of spaces of the first width w1 are formed in FIG. 2B. A width of each of the first to fourth side walls 100*a*, 100*b*, 100*c*, and 100*d* formed between the plurality of apertures 120 (i.e., the space or distance between adjacent apertures 120) in the cross-section on the X-Y plane may be referred to as a second width w2 (FIG. 1). As an embodiment, the first width w1 may be equal to or greater than the second width w2.

The first width w1 may be greater than thickness of each of the first to fourth side walls 100*a*, 100*b*, 100*c*, and 100*d* of the protection frame 100. When a pipe through which a fluid passes or flows is long, the flow of the fluid may be reduced due to friction between the fluid and the inner surface of the pipe. Accordingly, when the thickness of each of the first to fourth side walls 100*a*, 100*b*, 100*c*, and 100*d* is less than the first width w1, the fluid may be more smoothly introduced into or discharged from the inner space through the plurality of apertures 120. When the fluid is smoothly introduced and discharged, a fluid flow in the inner space is also smoother. Accordingly, heat transferred from the first to fourth side surfaces 200*a*, 200*b*, 200*c*, and 200*d* of the semiconductor chip 200 to fluids in the inner space increases, and thus, heat dissipation of the semiconductor chip 200 may be smoothly performed.

The plurality of apertures 120 may be formed by stacking one or more apertures in the vertical direction (Z-axis direction). As shown in FIG. 1, the plurality of apertures 120 may be formed in two lines or rows spaced apart in the vertical (i.e., Z) direction (i.e., the apertures 120 are arranged in two horizontal rows, as illustrated). As described below, the plurality of apertures 120 may also be formed in one row or three rows.

Figure 3A:
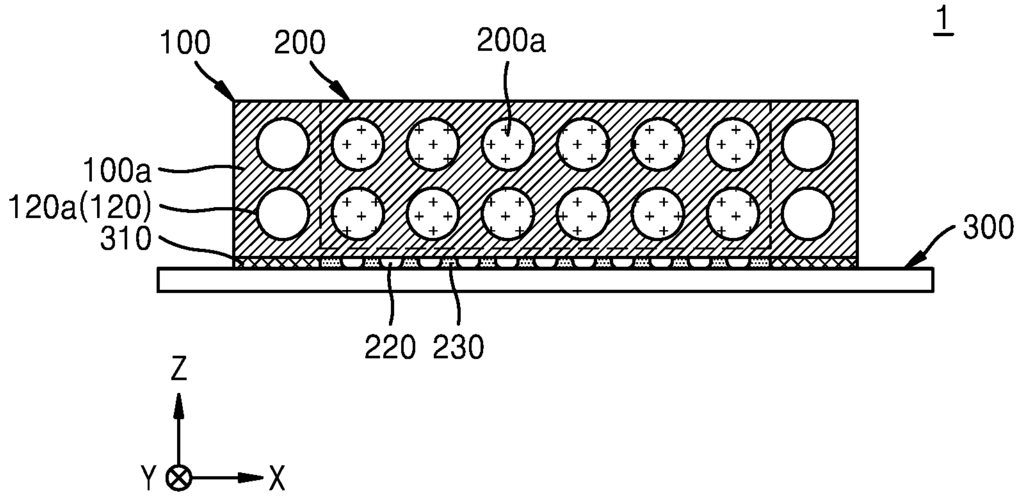
FIG. 3A is a side view of a chip protection device according to an embodiment.
Figure 3B:
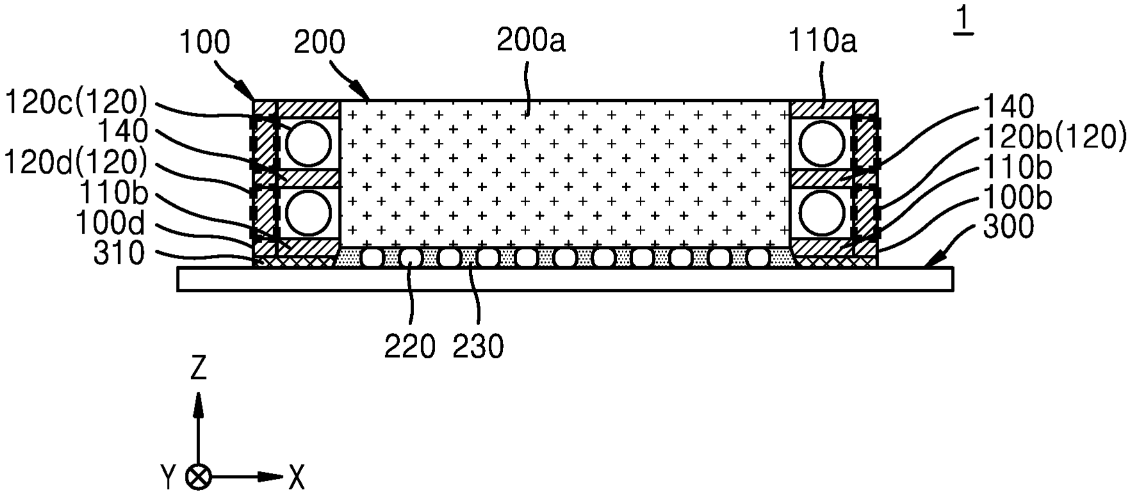
FIG. 3B is a cross-sectional view illustrating a chip protection device according to an embodiment taken from a line B-B' of FIG. 2A.

FIG. 3A is a side view of the chip protection device 1 according to an embodiment. FIG. 3B is a cross-sectional view illustrating the chip protection device 1 according to an embodiment taken from a line B-B' of FIG. 2A.

Referring to FIGS. 3A and 3B, the semiconductor chip 200 may be electrically connected to the substrate 300 through a connection terminal 220. An underfill layer 230 may be positioned around the connection terminal 220 between the semiconductor chip 200 and the substrate 300. The underfill layer 230 may surround the connection terminal 220 and may be positioned between the lower surface of the semiconductor chip 200 and the upper surface of the substrate 300. For example, the connection terminal 220 may be formed as a solder ball or a solder bump. The underfill layer 230 may include at least one of an insulating polymer or an epoxy resin. For example, the underfill layer 230 may include an epoxy molding compound (EMC).

As shown in FIG. 3A, a plurality of first apertures 120*a* may be formed in the first side wall 100*a* of the protection frame 100. Also, the first side surface 200*a* of the semiconductor chip 200 may be observed through some of the plurality of first apertures 120*a*.

As shown in FIG. 3B, when the cross-section of an embodiment is viewed from a direction in which the first side surface 200*a* of the semiconductor chip 200 is observed, the plurality of third apertures 120*c* formed by penetrating the third side wall 100*c* of the chip protection device 1 may be observed. The plurality of second apertures 120*b* formed in the second side wall 100*b* and the plurality of fourth apertures 120*d* formed in the fourth side wall 100*d* may not be observed by being respectively covered by the second side wall 100*b* and the fourth side wall 100*d*.

The protection frame 100 may include a horizontal barrier rib 140. The horizontal barrier rib 140 is positioned between the upper walls 110*a* of the protection frame 100 and the lower walls 110*b* of the protection frame 100. The upper walls 110*a*, the lower walls 110*b*, and the horizontal barrier rib 140 may be formed parallel to each other. The horizontal barrier rib 140 may contact parts of the first to fourth side surfaces 200*a*, 200*b*, 200*c*, and 200*d* of the semiconductor chip 200 opposite to the first to fourth side walls 100*a*, 100*b*, 100*c*, and 100*d*. The horizontal barrier rib 140 is positioned so as not to overlap or cover the plurality of apertures 120. In other words, the horizontal barrier rib 140 may be positioned so as to contact the first to fourth side walls 100*a*, 100*b*, 100*c*, and 100*d* between the plurality of apertures 120*a*, 120*b*, 120*c*, and 120*d*.

Figure 3C:
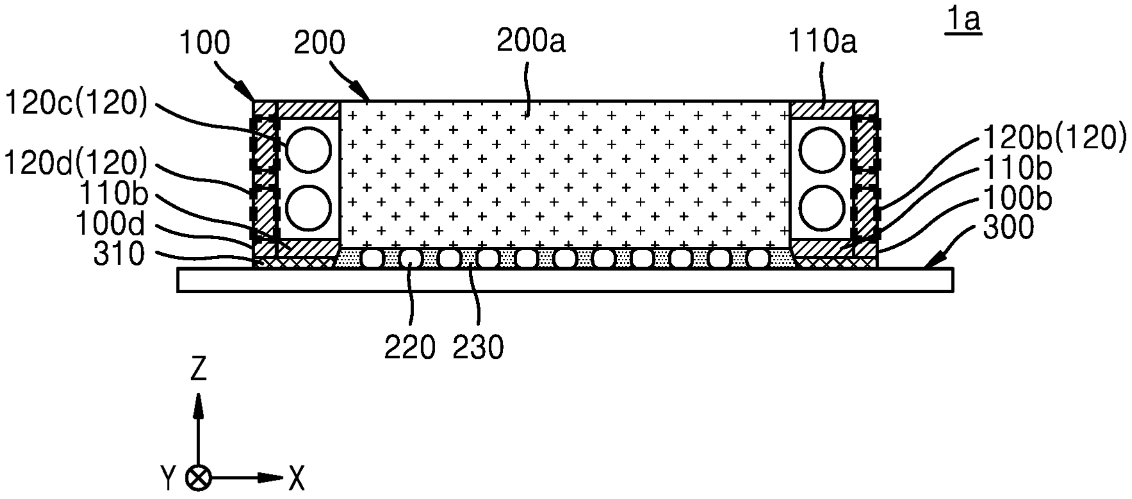
FIG. 3C is a cross-sectional view of a chip protection device according to an embodiment.

FIG. 3C is a cross-sectional view of a chip protection device 1*a* according to an embodiment which corresponds to the cross-sectional view of FIG. 3B. Referring to FIG. 3C, the protection frame 100 may not include the horizontal barrier rib 140. The horizontal barrier rib 140 may not be included in the protection frame 100 in order to secure a larger inner space than when the horizontal barrier rib 140 is present.

For example, when the horizontal barrier rib 140 is present, in the inner space, a fluid may be introduced into or discharged from through the plurality of apertures 120 without being greatly mixed up and down by being blocked by the horizontal barrier rib 140. In this case, the chip protection device 1 including the horizontal barrier 140 may be used.

For another example, the area of the first to fourth side surfaces 200*a*, 200*b*, 200*c*, and 200*d* of the semiconductor chip 200 exposed by the horizontal barrier rib 140 may be reduced, and the inner space may be narrowed so that the air flow in the inner space may deteriorate. In this case, the chip protection device 1*a* that does not include the horizontal barrier rib 140 may be used.

That is, the chip protection device 1 or 1*a* may include or may not include the horizontal barrier rib 140 so as to make the fluid flow smoother inside the chip protection device 1 or 1*a*.

Referring to FIGS. 2B and 3C together, a portion, such as a free edge, of each of the upper and lower walls 110*a* and 110*b* of the protection frame 100 may contact at least some of the first to fourth side surfaces 200*a*, 200*b*, 200*c*, and 200*d* of the semiconductor chip 200, as illustrated in FIG. 3B. When heat is generated due to the operation of the semiconductor chip 200, heat may be transferred to the portion of the upper and lower walls 110*a* and 110*b* of the protection frame 100 directly contacting the semiconductor chip 200. Therefore, in addition to heat dissipation of the semiconductor chip 200 according to the movement of the fluid, heat may be directly transferred to the protection frame 100 contacting the side surface(s) of the semiconductor chip 200 so that heat may be dissipated from the semiconductor chip 200.

Referring to FIGS. 2B and 3B together, an inner surface of the horizontal barrier rib 140 in the direction of the semiconductor chip 200 may contact the first to fourth side surfaces 200*a*, 200*b*, 200*c*, and 200*d* of the semiconductor chip 200. The heat generated from the semiconductor chip 200 may be transferred to the horizontal barrier rib 140. Accordingly, as described above, heat may be directly transferred to the protection frame 100 contacting the side surface of the semiconductor chip 200 so that heat may be dissipated from the semiconductor chip 200.

Figure 4A:
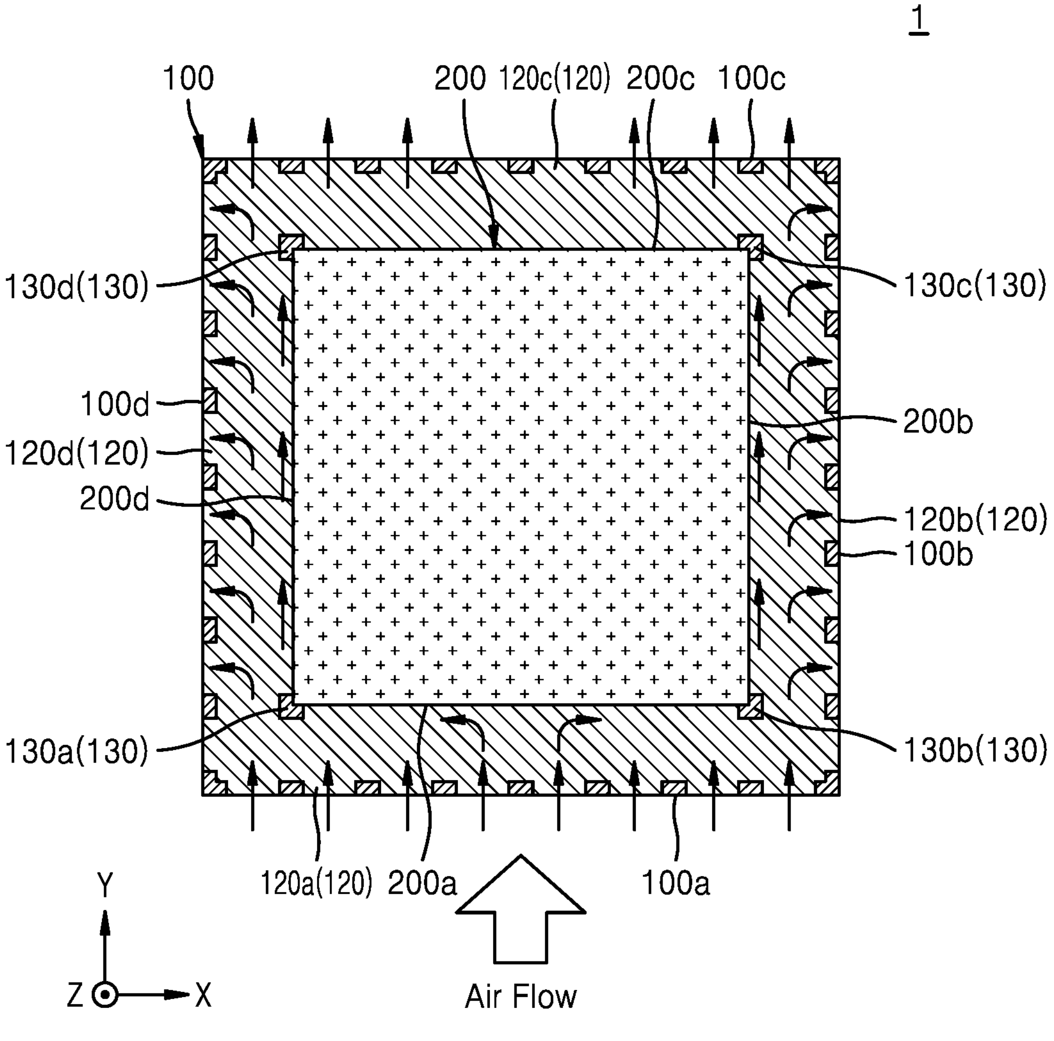
FIG. 4A is a cross-sectional view schematically illustrating an air flow that may occur in the cross-sectional view of FIG. 2B of a chip protection device according to an embodiment.
Figure 4B:
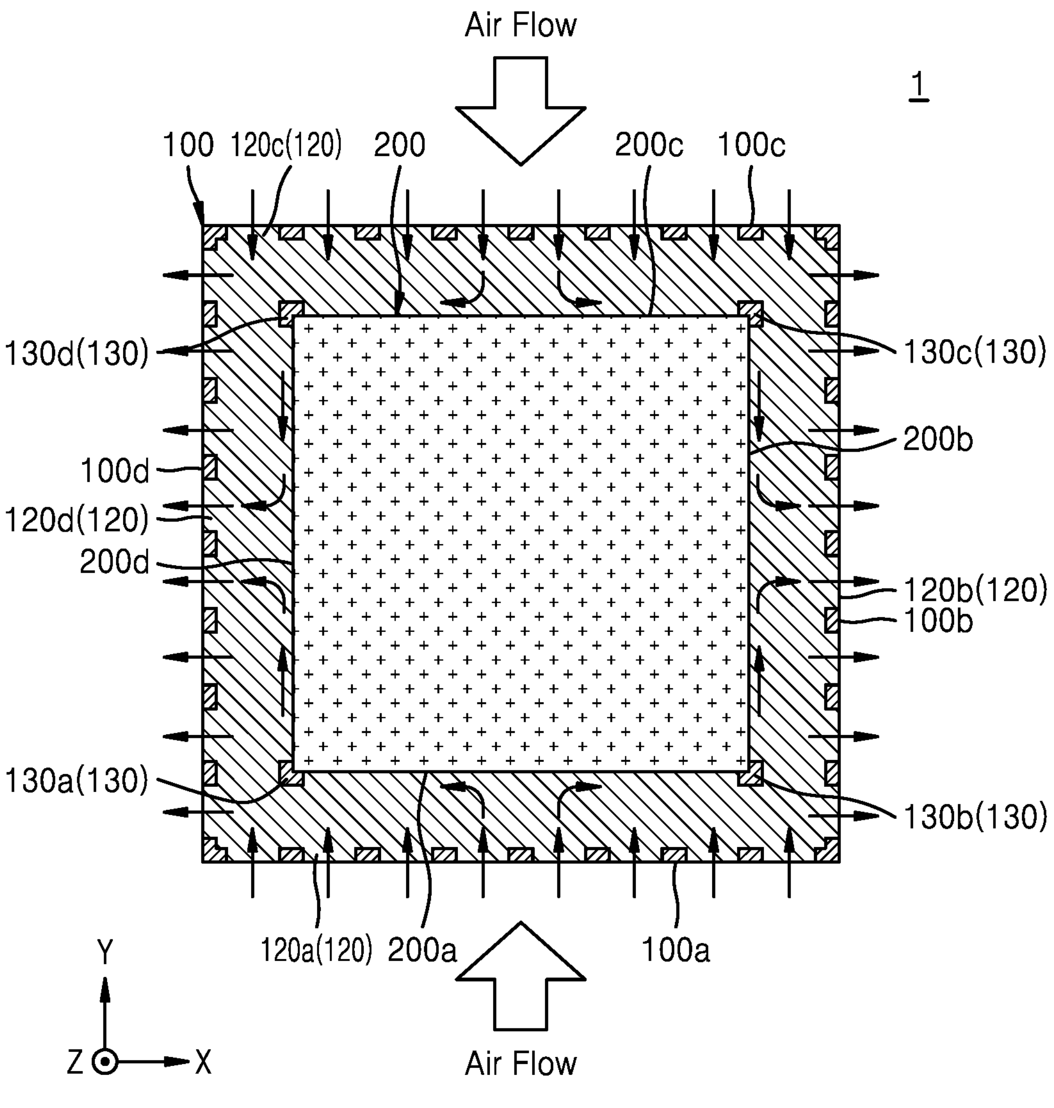
FIG. 4B is a cross-sectional view schematically illustrating an air flow that may occur in the cross-sectional view of FIG. 2B of a chip protection device according to an embodiment.

FIG. 4A is a cross-sectional view schematically illustrating the air flow that may occur in the cross-sectional view of FIG. 2B of the chip protection device 1 according to an embodiment. FIG. 4B is a cross-sectional view schematically illustrating the air flow that may occur in the cross-sectional view of FIG. 2B of the chip protection device 1 according to an embodiment.

Referring to FIG. 4A, an external forced fluid flow may be formed. Alternatively, the fluid flow may occur in a peripheral portion of the semiconductor chip 200 due to convection caused by a temperature difference between the peripheral portion and the semiconductor chip 200. The cause of the fluid flow occurring outside the semiconductor chip 200 is not limited to the present specification.

The fluid may be air or a gas including specific elements. Alternatively, the fluid may be a non-conductive liquid that may easily receive heat from the semiconductor chip 200. As an embodiment, the fluid may be air. Hereinafter, in the present specification, it will be described that the fluid is air. However, the inventive concept is not limited thereto.

The air flow toward the semiconductor chip 200 may exist from one side surface of the semiconductor chip 200 or the chip protection device 1. For example, the air flow may be directed toward the first side wall 100*a* of the protection frame 100. Air may be introduced into through the plurality of first apertures 120*a* formed in the first side wall 100*a*. The introduced air may pass through the first side wall 100*a* and enter inner spaces between the first to fourth side surfaces 200*a*, 200*b*, 200*c*, and 200*d* of the semiconductor chip 200 and the first to fourth side walls 100*a*, 100*b*, 100*c*, and 100*d*. Because there is no place for the air flow to escape from a central portion of the first side surface 200*a* of the semiconductor chip 200, air may flow in a direction of the second side surface 200*b* or the fourth side surface 200*d* along the surface of the first side surface 200*a*.

The air flowing along the surface of the first side surface 200*a* and the air introduced through the plurality of first apertures 120*a* may be introduced into the inner space positioned between the second side wall 100*b* and the second side surface 200*b*. Alternatively, the air flowing along the surface of the first side surface 200*a* and the air introduced through the plurality of first apertures 120*a* may be introduced into the inner space positioned between the fourth side wall 100*d* and the fourth side surface 200*d*.

The air introduced into the inner space positioned between the second side wall 100*b* and the second side surface 200*b* may escape through the plurality of second apertures 120*b* formed in the second side wall 100*b*. At the same time, air may flow along the surface of the second side surface 200*b* of the semiconductor chip 200 due to the air introduced into the inner space. Similarly, the air introduced into the inner space positioned between the fourth side wall 100*d* and the fourth side surface 200*d* may escape through the plurality of fourth apertures 120*d* formed in the fourth side wall 100*d*. At the same time, due to the air introduced into the inner space, air may flow along the surface of the fourth side surface 200*d* of the semiconductor chip 200.

Air that failed to escape through the plurality of second apertures 120*b* formed in the second side wall 100*b* may be introduced into the inner space between the third side wall 100*c* and the third side surface 200*c*. The introduced air may be discharged to the outside through the plurality of third apertures 120*c* formed in the third side wall 100*c*. Because the air flow is opposite to an outside air flow, the air flow is weak and thus there may be little or no air flowing along the third side surface 200*c*. In addition, there may be little or no air discharged through the plurality of third apertures 120*c* formed in the center of the third side wall 100*c*. Likewise, air that failed to escape through the plurality of third apertures 120*c* formed in the third side wall 100*c* may be introduced into the inner space between the third side wall 100*c* and the third side surface 200*c*. The introduced air may discharged to the outside through the plurality of third apertures 120*c* formed in the third side wall 100*c*. The air introduced into the plurality of apertures 120 may pass through the inner space and be discharged through the plurality of apertures 120. Although the air flow in FIG. 4A is indicated by an arrow, it will be understood that the actual flow rate, strength and direction of air in the practice of the inventive concept may be different from those described above.

The semiconductor chip 200 may be positioned on the substrate 300 and may receive power and operate. When receiving power and operating, the semiconductor chip 200 generates heat. A part of the semiconductor chip 200 where heat is mainly generated according to the arrangement and design of semiconductor devices inside the semiconductor chip 200 may vary depending on the semiconductor chip 200. However, for convenience of explanation, it is assumed that the heat generated by the semiconductor chip 200 is uniform within a certain range. The semiconductor chip 200 may generate heat so that the temperature of the semiconductor chip 200 may rise. When the temperature of the semiconductor chip 200 rises, air in contact with the semiconductor chip 200 may receive the heat. The temperature of the air that has received the heat may rise.

Convection may be divided into forced convection and natural convection. Although convection may vary depending on each case, in general, the larger the surface area in contact with the fluid, the greater the amount of heat transfer due to convection per unit time, and the greater the temperature difference between the surface in contact with the fluid and the fluid, the greater the amount of heat transfer due to convection per unit time. In the inventive concept, the plurality of apertures 120*a*, 120*b*, 120*c*, and 120*d* are respectively formed in the first to fourth side walls 100*a*, 100*b*, 100*c*, and 100*d* so that the outside air may be introduced into the inner space. In order to allow the air flowing in the inner space to contact the first to fourth side surfaces 200*a*, 200*b*, 200*c*, and 200*d* of the semiconductor chip 200 over a large area, the chip protection device 1 of the inventive concept is configured that the first to fourth side surfaces 200*a*, 200*b*, 200*c*, and 200*d* of the semiconductor chip 200 are exposed to the inner space.

The heat may be transferred from the semiconductor chip 200 to the air through convection formed by the chip protection device 1 of the inventive concept. The inner space of the chip protection device 1, shapes exposing the first to fourth side surfaces 200*a*, 200*b*, 200*c*, and 200*d* of the semiconductor chip 200, and the plurality of apertures 120 formed in the first to fourth side walls 100*a*, 100*b*, 100*c*, and 100*d* allow the wider side surface of the semiconductor chip 200 to come into contact with the air flow. Accordingly, the amount of heat transfer of the semiconductor chip 200 to ambient air may increase. The temperature rise caused by the operation of the semiconductor chip 200 may be reduced through the chip protection device 1 of the inventive concept. That is, the semiconductor chip 200 may be protected through the chip protection device 1, and at the same time, heat may be dissipated from the semiconductor chip 200 through the air flow induced by the chip protection device 1. In other words, the temperature of at least a part of the air discharged through the plurality of apertures 120 by receiving the heat of the semiconductor chip 200 in the inner space may be higher than the temperature of the air introduced through the plurality of apertures 120.

Referring to FIG. 4B, an external fluid flow may be formed for the same reason as in FIG. 4A. Alternatively, the fluid flow may occur in the peripheral portion of the semiconductor chip 200 due to convection due to the temperature difference between the peripheral portion and the semiconductor chip 200. However, unlike FIG. 4A, the external fluid flow may occur toward the surfaces 200*a* and 200*c* of the semiconductor chip 200 facing each other.

The external fluid flow may be directed toward the first side wall 100*a* of the protection frame 100. Air may be introduced through the plurality of first apertures 120*a* formed in the first side wall 100*a*. Likewise, the external fluid flow may be directed toward the third side wall 100*c*. Air may be introduced through the plurality of third apertures 120*c* formed in the third side wall 100*c*.

The introduced air may pass through the first side wall 100*a* and enter the inner spaces between the first to fourth side surfaces 200*a*, 200*b*, 200*c*, and 200*d* of the semiconductor chip 200 and the first to fourth side walls 100*a*, 100*b*, 100*c*, and 100*d* of the protection frame 100. Because there is no place for the air flow to directly escape from the central portion of the first side surface 200*a* of the semiconductor chip 200, air may flow in a direction of the second side surface 200*b* or the fourth side surface 200*d* along the surface of the first side surface 200*a*. Likewise, the introduced air may pass through the third side wall 100*c* and enter the inner spaces between the first to fourth side surfaces 200*a*, 200*b*, 200*c*, and 200*d* of the semiconductor chip 200 and the first to fourth side walls 100*a*, 100*b*, 100*c*, and 100*d* of the protection frame 100. Because there is no place for the air flow to directly escape from the central portion of the third side surface 200*c* of the semiconductor chip 200, air may flow in a direction of the second side surface 200*b* or the fourth side surface 200*d* along the surface of the third side surface 200*c*.

Among the air introduced into the first side wall 100*a* and the third side wall 100*c*, air that failed to escape may be introduced into the inner space between the second side wall 100*b* and the second side surface 200*b* or the inner space between the fourth side wall 100*d* and the fourth side surface 200*d*. Owing to the air introduced into the inner space, air may flow along the surface of the second side surface 200*b* of the semiconductor chip 200 and the surface of the fourth side surface 200*d* of the semiconductor chip 200. Air may be discharged through the plurality of second apertures 120*b* formed in the second side wall 100*b* or the plurality of fourth apertures 120*d* formed in the fourth side wall 100*d*. Although the air flow in FIG. 4B is indicated by an arrow, it will be understood that the actual flow rate, strength and direction of air in the practice of the inventive concept may be different from those described above.

As in FIG. 4A, in the inventive concept, the plurality of apertures 120 are formed in the first to fourth side walls 100*a*, 100*b*, 100*c*, and 100*d* so that the outside air may be introduced into the inner space of the protection frame 100. The protection frame 100 is configured to expose the side surfaces 200*a*, 200*b*, 200*c*, 200*d* of the semiconductor chip 200 so that the air flowing in the inner space may contact the first to fourth side surfaces 200*a*, 200*b*, 200*c*, and 200*d* of the semiconductor chip 200 over a large area. Accordingly, the amount of heat transfer of the semiconductor chip 200 to ambient air may increase. The temperature rise caused by the operation of the semiconductor chip 200 may be reduced through the chip protection device 1 of the inventive concept. That is, the semiconductor chip 200 may be protected through the chip protection device 1, and at the same time, heat may be dissipated from the semiconductor chip 200 through the air flow induced by the chip protection device 1. In other words, the temperature of at least a part of the air discharged through the plurality of apertures 120 by receiving the heat of the semiconductor chip 200 in the inner space may be higher than the temperature of the air introduced through the plurality of apertures 120.

Figure 5:
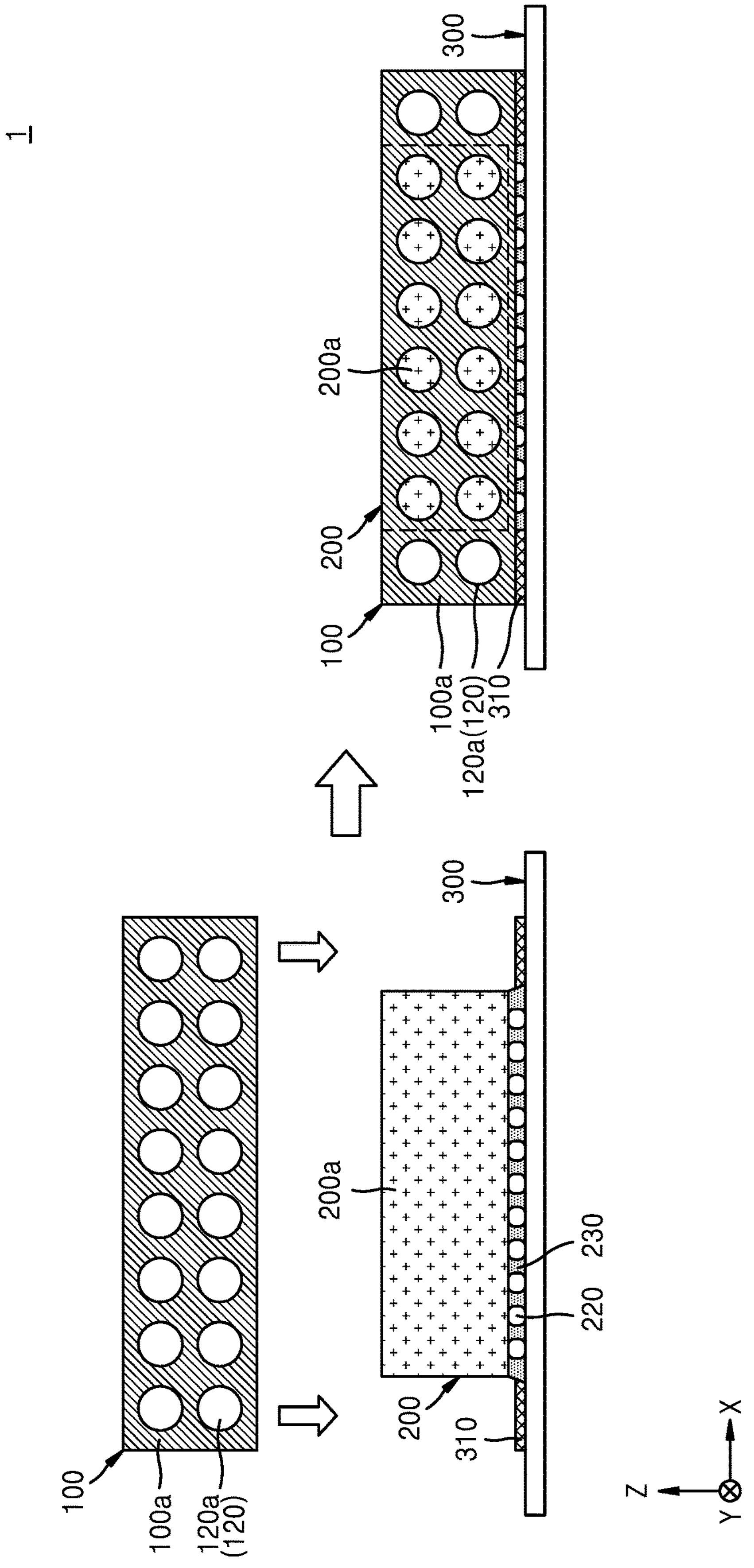
FIG. 5 is a side view illustrating a chip protection device according to an embodiment that is mounted.

FIG. 5 is a side view illustrating the chip protection device 1 according to an embodiment that is mounted. Referring to FIG. 5, the semiconductor chip 200 is electrically connected to the substrate 300 through the connection terminal 220. As described above, the underfill layer 230 may be filled in a space between the semiconductor chip 200 and the substrate 300 while surrounding the connection terminal 220. The adhesive layer 310 may be applied to the upper surface of the substrate 300 along the circumference of the semiconductor chip 200. The adhesive layer 310 may be applied to a region equal to or narrower than the shape of the chip protection device 1 viewed in the +Z direction. The thickness of the adhesive layer 310 may be exaggerated for illustration in the present specification. The adhesive layer 310 may adhere the substrate 300 and the chip protection device 1 to each other and may include a non-conductive material.

As described above, a space in which the semiconductor chip 200 may be positioned is provided in the central portion of the chip protection device 1. Accordingly, the chip protection device 1 may be slid into contact with the side surface of the semiconductor chip 200 mounted on the upper surface of the substrate 300. The lower walls 110*b* of the protection frame 100 may be in contact with the adhesive layer 310 and a certain level of pressure or heat may be applied thereto so that the adhesive layer 310 and the substrate 300 and the chip protection device 1 may be bonded or fixed.

The chip protection device 1 may include metal. The temperature of the chip protection device 1 may rise when the chip protection device 1 receives heat of the semiconductor chip 200 through air or directly receives heat through a part thereof in contact with a part of the semiconductor chips 200. Therefore, the chip protection device 1 may include a metal of high thermal conductivity. As an embodiment, the chip protection device 1 may include one or more of metals such as Cu, Al, Fe, Ag, Au, Pb, Ni, and Pt. When the chip protection device 1 includes metal, the chip protection device 1 may be manufactured by metal processing using a laser. As an embodiment, the chip protection device 1 may be manufactured by forming a metal molded in a hexahedron into a plurality of apertures through a laser.

The chip protection device 1 may include a polymer. When the chip protection device 1 includes polymer, the chip protection device 1 may be manufactured by casting polymer through a mold, or the chip protection device 1 may be manufactured by additionally processing a resultant of casting. However, a method of manufacturing the chip protection device 1 is not limited by the present specification.

Figure 6:
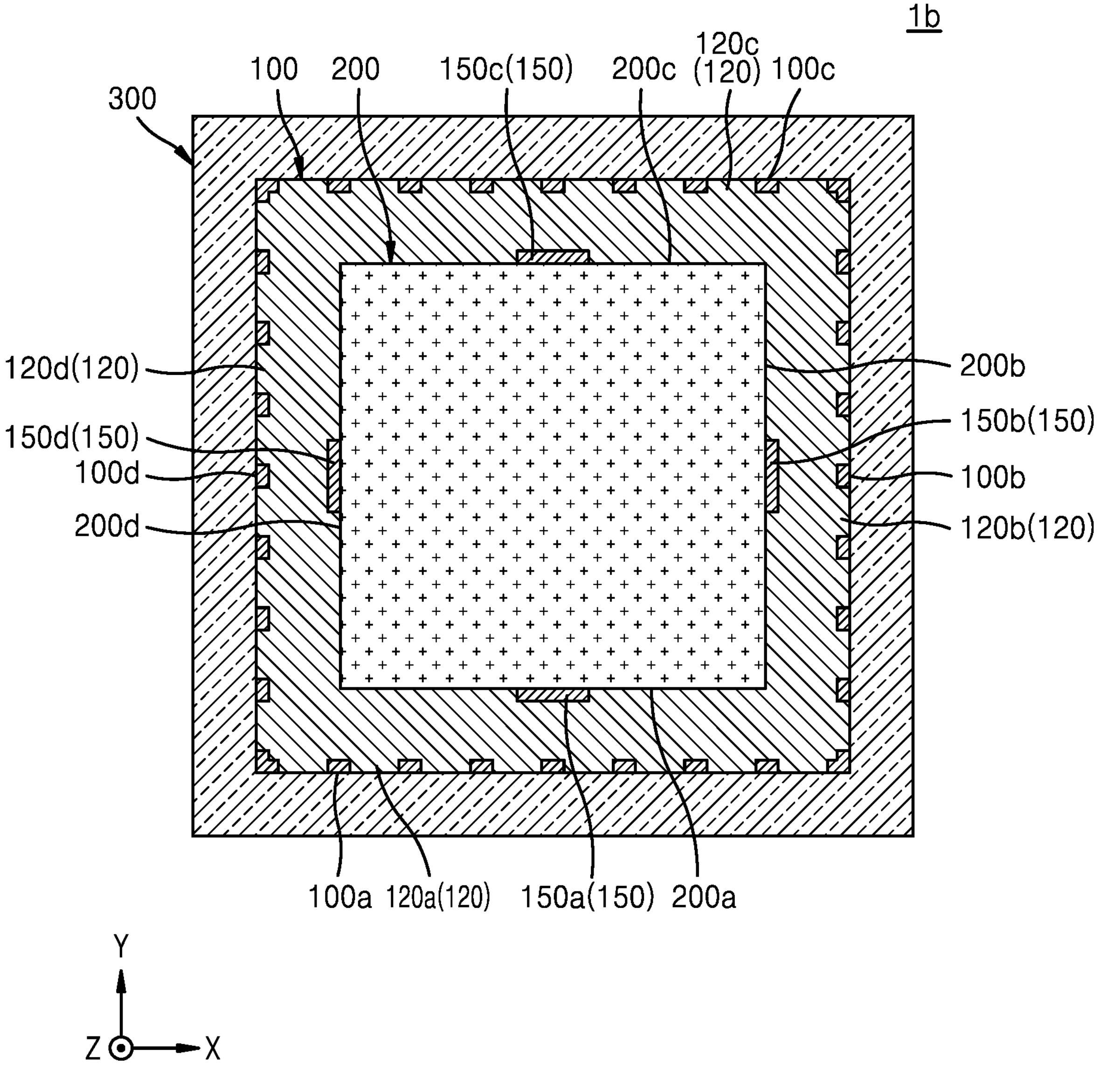
FIG. 6 is a cross-sectional view of a chip protection device according to an embodiment.

FIG. 6 is a cross-sectional view of a chip protection device 1*b* according to an embodiment that corresponds to the cross-sectional view of FIG. 2B. Referring to FIG. 6, the protection frame 100 may include supports 150 different from those in FIG. 2B. Supports 150*a*, 150*b*, 150*c*, and 150*d* may be positioned between the upper walls 110*a* of the protection frame 100 and the lower walls 110*b* to be described below, and connect the upper walls 110*a* of the protection frame 100 to the lower walls 110*b* to be described below to support the upper walls 110*a*.

As an embodiment, the supports 150 may be configured to have an 'I' shape in a cross-section on the X-Y plane. The semiconductor chip 200 may come into contact with inner sides of the supports 150 having an 'I'-shape. The outer sides of the supports 150*a*, 150*b*, 150*c*, and 150*d* having an 'I'-shape may be configured to face the inner spaces between the first to fourth side walls 100*a*, 100*b*, 100*c*, and 100*d* of the protection frame 100 and the first to fourth side surfaces 200*a*, 200*b*, 200*c*, and 200*d* of the semiconductor chip 200. The supports 150*a*, 150*b*, 150*c*, and 150*d* may be respectively positioned on the side surfaces of the semiconductor chip 200. That is, when the semiconductor chip 200 is a hexahedron, four supports may be configured as shown in FIG. 6.

The supports 150 directly contact the side surfaces of the semiconductor chip 200 to fix the position of the chip protection device 1*b* with respect to the semiconductor chip 200. As described above, the position of the chip protection device 1*b* in the Z-axis direction with respect to the semiconductor chip 200 may be fixed through the adhesive layer 310 applied to the substrate 300. The supports 130 constituting the protection frame 100 come into contact with the semiconductor chip 200 to fix the position of the chip protection device 1*b* in the X-axis and Y-axis directions with respect to the semiconductor chip 200. Accordingly, the positions of the chip protection device 1*b* in three axes may be fixed with respect to the semiconductor chip 200.

The shapes of the supports 150 in FIG. 6 are in close contact with the side surfaces of the semiconductor chip 200 and are less affected by air flow, and thus, the air flow may be formed in the inner space as described in FIG. 4A or 4B. Accordingly, the chip protection device 1*b* including the supports 150 having an 'I'-shape may protect the semiconductor chip 200 and improve heat dissipation performance at the same time.

Figure 7A:
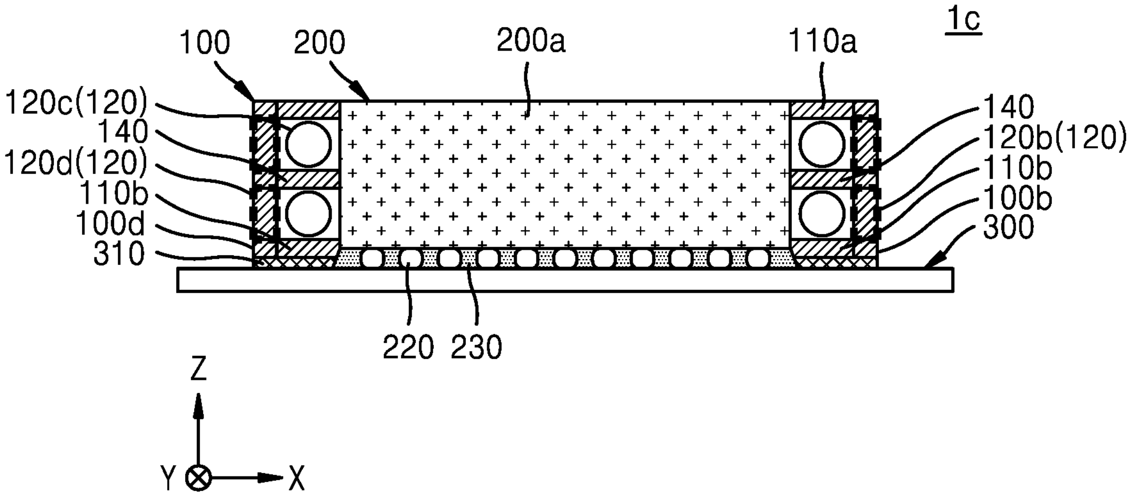
FIG. 7A is a cross-sectional view of a chip protection device according to an embodiment.
Figure 7B:
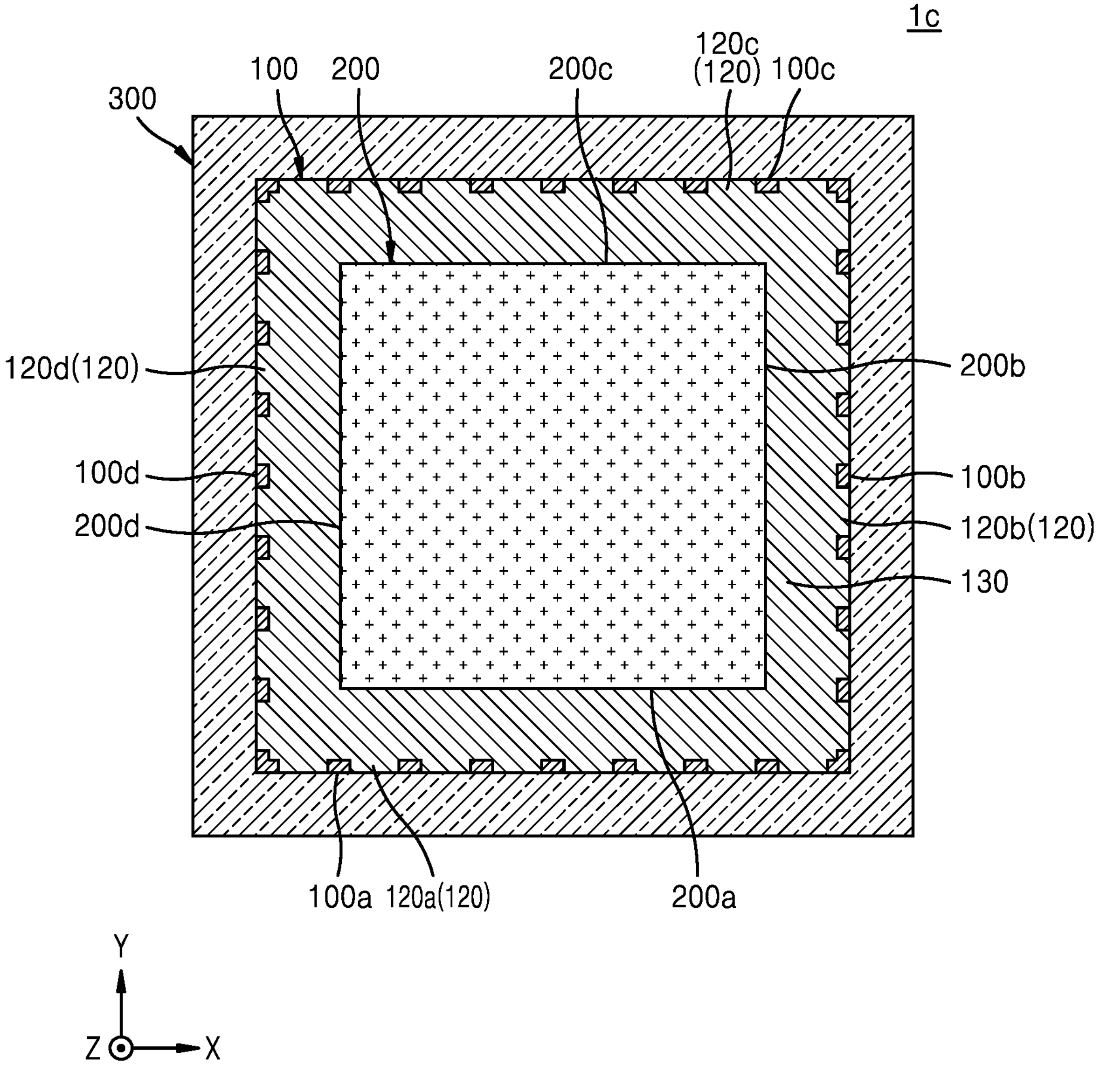
FIG. 7B is a cross-sectional view of a chip protection device according to an embodiment.

FIG. 7A is a cross-sectional view of a chip protection device 1*c* according to an embodiment that corresponds to the cross-sectional view of FIG. 3B. FIG. 7B is a cross-sectional view of the chip protection device 1*c* according to an embodiment that corresponds to the cross-sectional view of FIG. 2B.

Referring to FIGS. 7A and 7B, the protection frame 100 may not include the supports 130 and 150. A portion of each of the lower walls 110*b*, such as the free edge, may come into contact with the first to fourth side surfaces 200*a*, 200*b*, 200*c*, and 200*d* of the semiconductor chip 200, respectively. As shown in FIG. 7A, the free edge of each upper wall 110*a* of the protection frame 100, the side surface of the horizontal barrier rib 140, and the free edge of each of the lower walls 110*b* of the protection frame 100 may come into contact with the first to fourth side surfaces 200*a*, 200*b*, 200*c*, and 200*d* of the semiconductor chip 200. Accordingly, the position of the protection frame 100 in X-axis and Y-axis directions may be fixed with respect to the semiconductor chip 200 due to the contact with the first to fourth side surfaces 200*a*, 200*b*, 200*c*, and 200*d* of the semiconductor chip 200. As described above, the position of the protection frame 100 in the Z-axis direction with respect to the semiconductor chip 200 is fixed due to the adhesive layer 310. Accordingly, the positions of the chip protection device 1*c* in three axes may be fixed with respect to the semiconductor chip 200.

In the case of the chip protection device 1*c* of FIGS. 7A and 7B which does not include the supports 130 and 150, an area in which the first to fourth side surfaces 200*a*, 200*b*, 200*c*, and 200*d* of the semiconductor chip 200 are not exposed to the inner space is reduced compared to the case where the supports 130 and 150 are present. Therefore, heat dissipation of the semiconductor chip 200 may be more effective. That is, the chip protection device 1*c* of FIGS. 7A and 7B may effectively dissipate heat from the semiconductor chip 200 and protect the semiconductor chip 200 at the same time.

Figure 8:
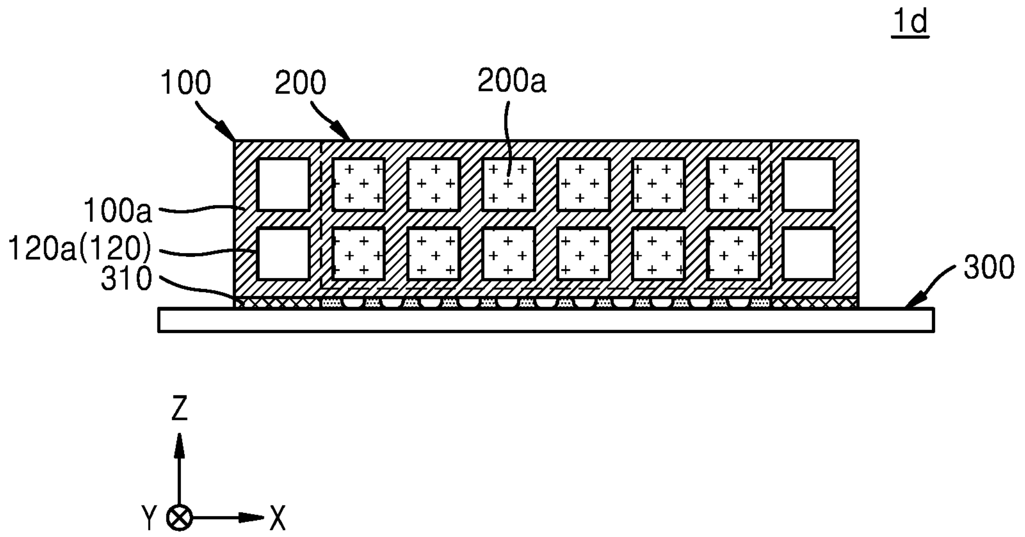
FIG. 8 is a side view of a chip protection device according to an embodiment.

FIG. 8 is a side view of a chip protection device 1*d* according to an embodiment. Redundant descriptions with those provided above are omitted.

Referring to FIG. 8, the plurality of apertures 120*a*, 120*b*, 120*c*, and 120*d* may be formed in a rectangular shape. As an embodiment, the plurality of apertures 120*a*, 120*b*, 120*c*, and 120*d* may be formed in a square shape. When the plurality of apertures 120 are formed in a rectangular shape, the area occupied by the plurality of apertures 120 on the first to fourth side walls 100*a*, 100*b*, 100*c*, and 100*d* of the protection frame 100 may further increase compared to the case where the plurality of apertures 120 described above are circular. When the cross-sectional area of each of the plurality of apertures 120 increases, or when the cross-sectional area occupied by the plurality of apertures 120 respectively on the first to fourth side walls 100*a*, 100*b*, 100*c*, and 100*d* increases, the fluid flow may more smoothly pass through the plurality of apertures 120 and enter and exit. When the fluid flow passing through the plurality of apertures 120 increases or the flow rate of the fluid increases, heat dissipation of the semiconductor chip 200 may be effectively achieved.

Figure 9A:
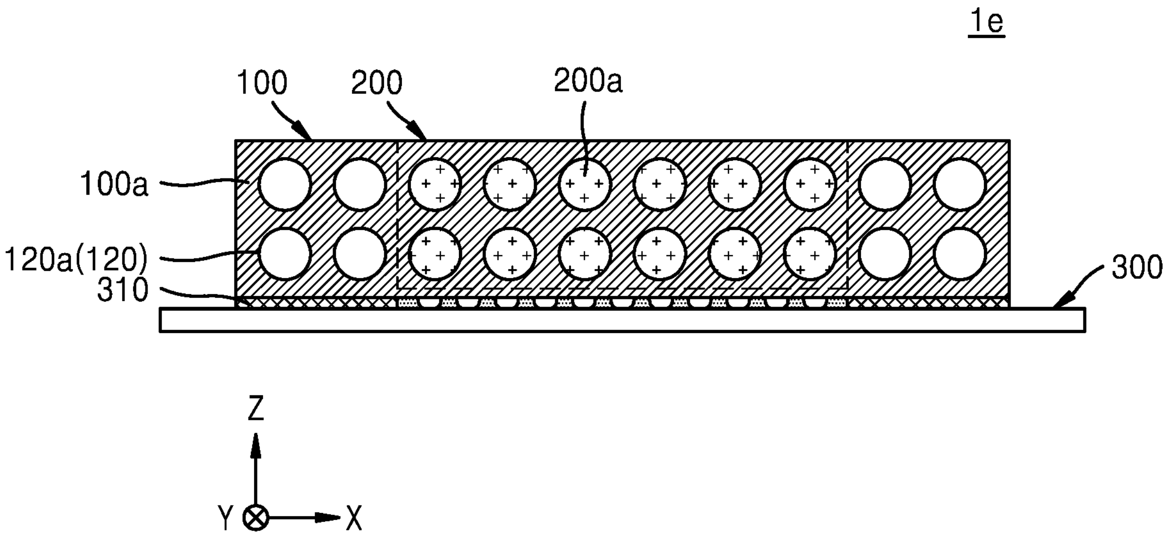
FIG. 9A is a side view of a chip protection device according to an embodiment.
Figure 9B:
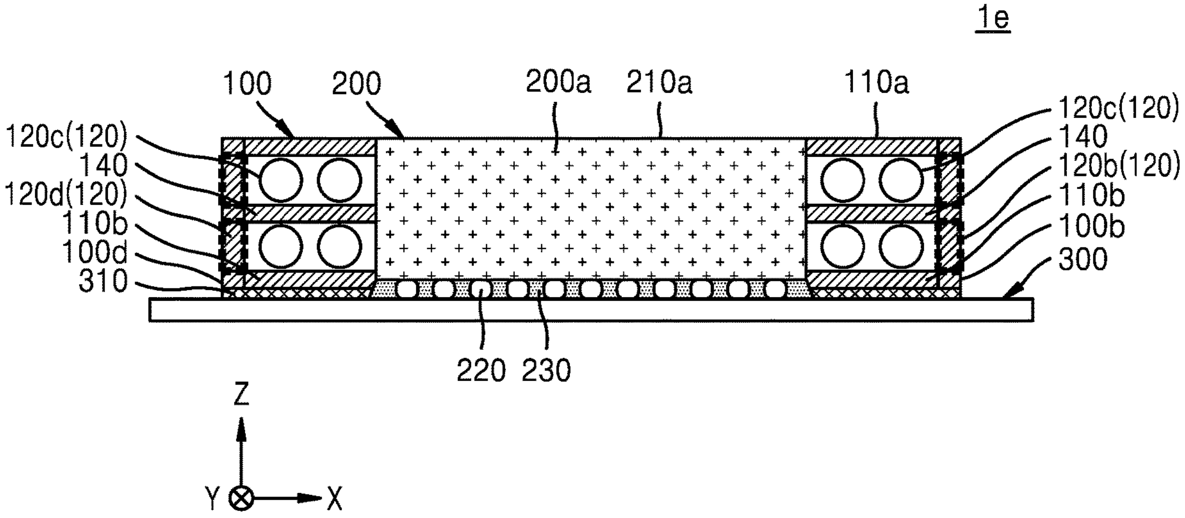
FIG. 9B is a cross-sectional view of a chip protection device according to an embodiment.

FIG. 9A is a side view of a chip protection device 1*e* according to an embodiment. FIG. 9B is a cross-sectional view of the chip protection device 1*e* according to an embodiment that corresponds to the cross-sectional view of FIG. 3B. Redundant descriptions with those provided above are omitted.

Referring to FIG. 9A, in the chip protection device 1 described above, the chip protection device 1*e* may extend in the X-axis direction or Y-axis direction rather than a region (indicated by a dotted line) of the side surface of the semiconductor chip 200. A greater number of the plurality of apertures 120 may be formed in the first to fourth side walls 100*a*, 100*b*, 100*c*, and 100*d* of the protection frame 100 included in the extended chip protection device 1*e* than in the chip protection device 1 described above. As shown in FIG. 9B, the inner space is wider, and the flow of air entering and exiting through the plurality of apertures 120 may be more smooth. As described above, the horizontal barrier rib 140 may or may not be included in the chip protection device 1*e* as needed, and the supports 130 and 150 may also be included or not included in the chip protection device 1*e* as needed.

Figure 10:
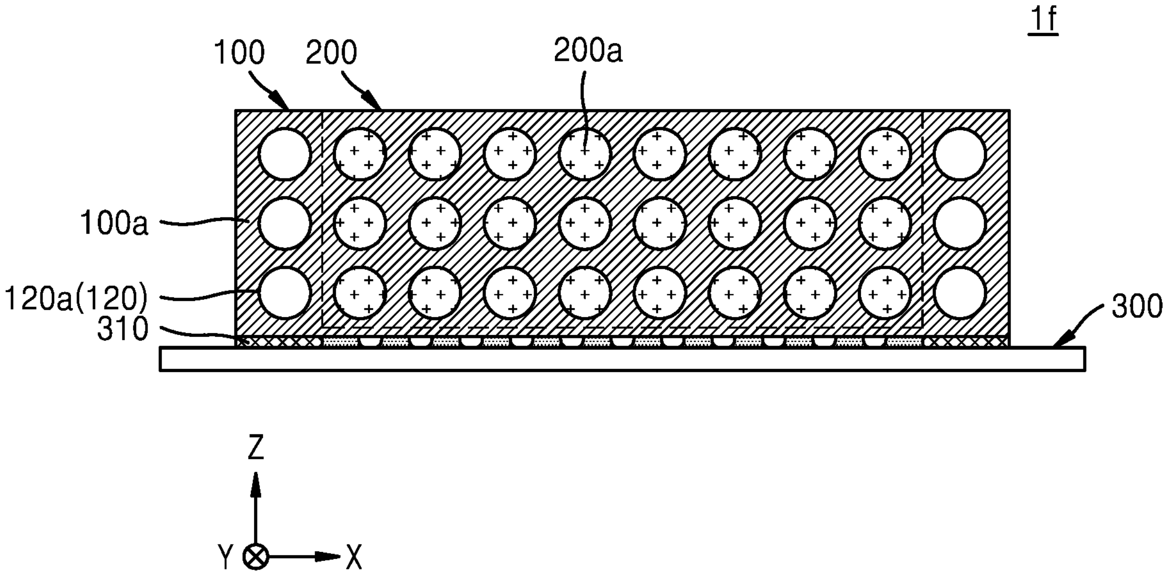
FIG. 10 is a side view of a chip protection device according to an embodiment.
Figure 11:
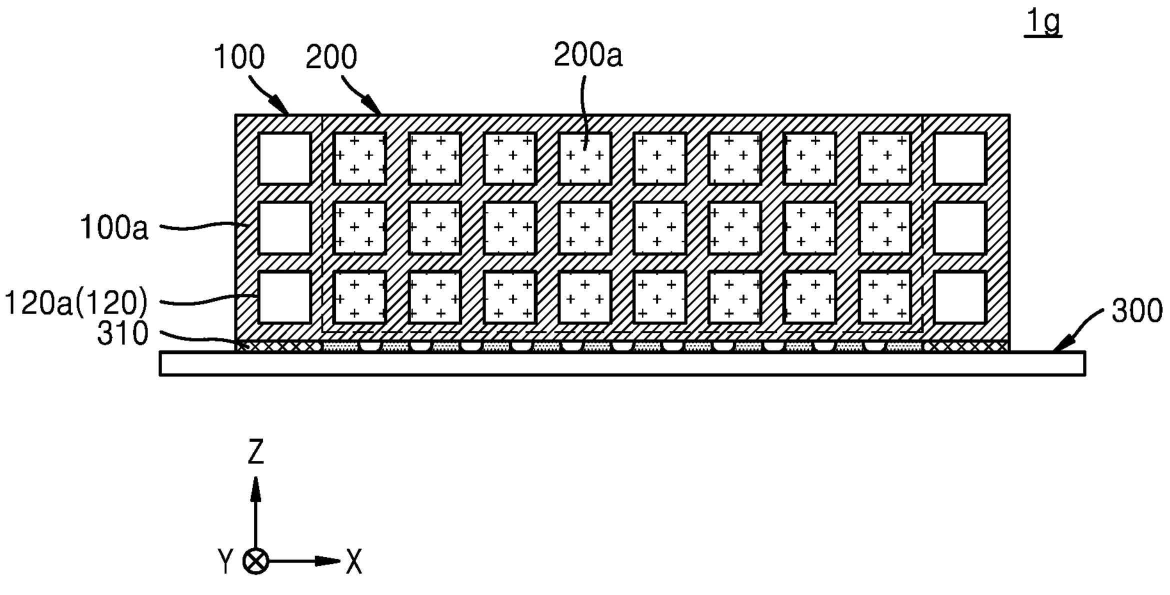
FIG. 11 is a side view of a chip protection device according to an embodiment.

FIG. 10 is a side view of a chip protection device if according to an embodiment. FIG. 11 is a side view of a chip protection device 1g according to an embodiment. Redundant descriptions with those provided above are omitted.

Referring to FIGS. 10 and 11, the plurality of apertures 120 may be continuously arranged in three lines in a vertical direction (Z-axis direction) (i.e., the apertures 120 are arranged in three horizontal rows, as illustrated). The plurality of apertures 120 may be used when the semiconductor chip 200 is thick or when the chip protection device if is configured with a plurality of smaller apertures 120.

As shown in FIG. 10, the plurality of apertures 120 may be continuously arranged in three lines in the vertical direction (Z-axis direction) (i.e., the apertures 120 are arranged in three horizontal rows, as illustrated), and may have a circular shape. For example, the circular shape of the plurality of apertures 120 may be an ellipse.

As shown in FIG. 11, the plurality of apertures 120 are continuously arranged in three lines in the vertical direction (Z-axis direction) (i.e., the apertures 120 are arranged in three horizontal rows, as illustrated), and may have a rectangular shape. For example, the rectangular shape of the plurality of apertures 120 may be a square.

Figure 12:
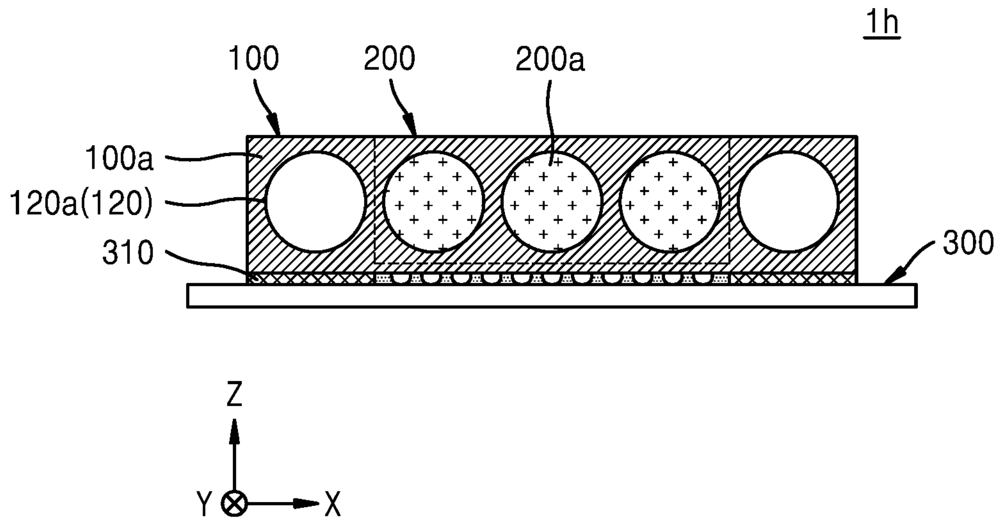
FIG. 12 is a side view of a chip protection device according to an embodiment.

FIG. 12 is a side view of a chip protection device 1*h* according to an embodiment. Redundant descriptions with those provided above are omitted.

Referring to FIG. 12, the plurality of apertures 120 may be formed in only one row in the vertical direction (Z-axis direction) (i.e., the apertures 120 are arranged in a single horizontal row, as illustrated). When the plurality of apertures 120 are formed in only one row in the vertical direction, the size or area of one of the plurality of apertures 120 may be larger than when the plurality of apertures 120 are formed in two or more lines in the vertical direction. As an embodiment, the plurality of apertures 120 may be formed in a circular shape.

When a fluid passes through a pipe, the fluid may not flow effectively inside the pipe when the diameter of the pipe is small due to friction between the inner surface of the pipe and the fluid. The plurality of apertures 120 each having a large size or area are formed in the first to fourth side walls 100*a*, 100*b*, 100*c*, and 100*d* compared to the chip protection device 1 described above, and thus, air may more effectively enter and exit through the plurality of apertures 120. When the air enters and exits effectively, the air flow in the inner space of the chip protection device 1*h* may be faster or the air flow rate may increase. Accordingly, heat may be effectively dissipated from the semiconductor chip 200 through the chip protection device 1*h* in which the plurality of apertures 120 of the large size or area are formed.

Figure 13:
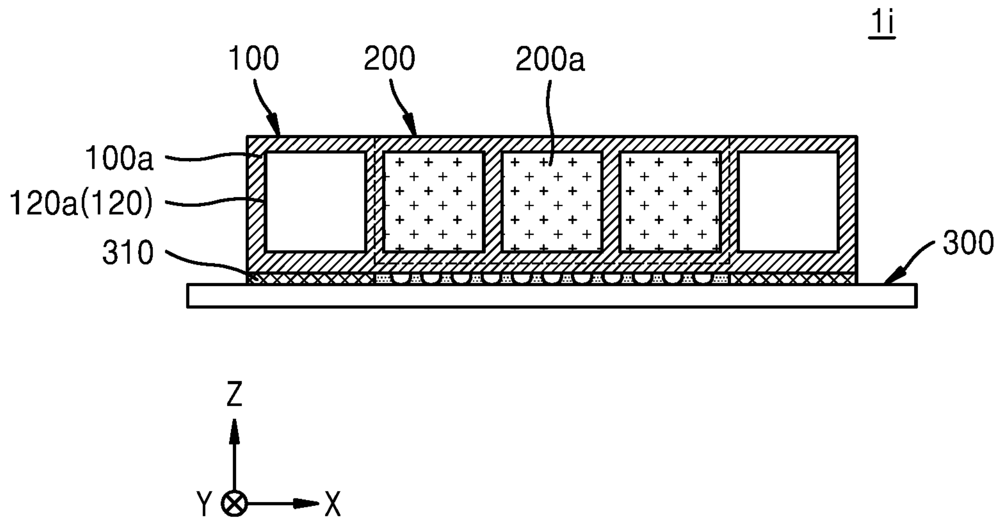
FIG. 13 is a side view of a chip protection device according to an embodiment.

FIG. 13 is a side view of a chip protection device 1*i* according to an embodiment. Redundant descriptions with those provided above are omitted.

Referring to FIG. 13, the plurality of apertures 120 in a rectangular shape may be formed in one line in the vertical direction (Z-axis direction) (i.e., the apertures 120 are arranged in one horizontal row, as illustrated). As an embodiment, the plurality of apertures 120 may have a square shape. As described above, the size or area of each of the plurality of apertures 120 having a rectangular shape may be larger than that of each of the plurality of apertures 120 having a circular shape. In addition, when the plurality of apertures 120 are formed in one line in the vertical direction, air may more effectively enter and exit through the plurality of apertures 120. Accordingly, the chip protection device 1*i* of FIG. 13 may more effectively dissipate heat from the semiconductor chip 200 than the chip protection device 1.

While the inventive concept has been particularly shown and described with reference to embodiments thereof, it will be understood that various changes in form and details may be made therein without departing from the scope of the following claims.

What is claimed is:

1. A chip protection device comprising:

a protection frame configured to extend around side surfaces of a semiconductor chip when mounted on a substrate, wherein the protection frame comprises:

a plurality of side walls, each side wall configured to face and be spaced apart from a respective side surface of the semiconductor chip, and a plurality of upper walls, each upper wall extending inward from an upper portion of a respective one of the plurality of side walls;

a plurality of supports extending between and connecting the plurality of upper walls to a plurality of lower walls, the plurality of supports spaced apart from the plurality of side walls; and a plurality of apertures formed through at least some of the plurality of side walls, and wherein the plurality of side walls and upper walls define an inner space through which a fluid can flow via the plurality of apertures.

2. The chip protection device of claim 1, wherein the plurality of apertures are horizontally and vertically aligned.

3. The chip protection device of claim 1, wherein each of the plurality of apertures has a circular or rectangular shape.

4. The chip protection device of claim 1, wherein the protection frame further comprises a barrier rib positioned between the side surfaces of the semiconductor chip and the plurality of side walls, and wherein the barrier rib is configured to be parallel to the plurality of upper walls of the protection frame.

5. The chip protection device of claim 1, wherein the protection frame comprises at least one or more of Cu, Al, Fe, Ag, Au, Pb, Ni and Pt.

6. The chip protection device of claim 1, wherein the protection frame further comprises the plurality of lower walls, each lower wall extending inward from a lower portion of a respective one of the plurality of side walls toward the semiconductor chip.

7. The chip protection device of claim 6, wherein each support of the plurality of supports is positioned at a respective corner of the semiconductor chip, and wherein the plurality of supports extend between and connect the plurality of upper walls to the plurality of lower walls.

8. The chip protection device of claim 6, wherein each support of the plurality of supports is positioned at a respective side surface of the semiconductor chip, and wherein the plurality of supports extend between and connect the plurality of upper walls to the plurality of lower walls.

9. The chip protection device of claim 6, wherein a portion of each of the plurality of upper walls contacts a respective side surface of the semiconductor chip, and wherein a portion of each of the plurality of lower walls contacts a respective side surface of the semiconductor chip.

10. The chip protection device of claim 2, wherein the plurality of apertures are arranged in three horizontal rows.

11. The chip protection device of claim 2, wherein the plurality of apertures are arranged in a single horizontal row, and wherein the plurality of apertures each have a rectangular shape.

12. The chip protection device of claim 1, wherein the plurality of upper walls of the protection frame are coplanar with an upper surface of the semiconductor chip.

13. The chip protection device of claim 1, wherein the plurality of apertures are formed in two side walls of the protection frame that are opposite each other.

14. The chip protection device of claim 1, wherein the plurality of apertures are formed in each of the plurality of side walls.

15. A chip protection device comprising:

a protection frame extending around side surfaces of a semiconductor chip mounted on a substrate, wherein the protection frame comprises a plurality of side walls, each side wall facing and spaced apart from a respective side surface of the semiconductor chip, a plurality of upper walls, each upper wall extending inward from an upper portion of a respective one of the plurality of side walls toward the semiconductor chip, and a plurality of lower walls, each lower wall extending inward from a lower portion of a respective one of the plurality of side walls toward the semiconductor chip; and a plurality of apertures formed through at least some of the plurality of side walls, wherein the plurality of side walls, the plurality of upper walls, and the plurality of lower walls define an inner space through which a fluid can flow via the plurality of apertures, wherein a portion of at least one of the plurality of upper walls contacts a respective side surface of the semiconductor chip, and wherein a portion of at least one of the plurality of lower walls contacts a respective side surface of the semiconductor chip.

16. The chip protection device of claim 15, wherein a width of each of the plurality of apertures is greater than a thickness of each of the plurality of side walls.

17. The chip protection device of claim 15, wherein a width of each of the plurality of apertures is greater than or equal to a distance between adjacent ones of the plurality of apertures.

18. The chip protection device of claim 15, wherein a distance between adjacent ones of the plurality of apertures is the same, and wherein a shape of each of the plurality of apertures is the same.

19. A chip protection device comprising:

a protection frame extending around side surfaces of a semiconductor chip mounted on a substrate, wherein the protection frame comprises a plurality of side walls, each side wall facing and spaced apart from a respective side surface of the semiconductor chip, a plurality of upper walls, each upper wall extending inward from an upper portion of a respective one of the plurality of side walls toward the semiconductor chip, and a plurality of lower walls, each lower wall extending inward from a lower portion of a respective one of the plurality of side walls toward the semiconductor chip; and a plurality of apertures formed through at least some of the plurality of side walls, wherein the plurality of apertures are aligned horizontally and vertically, wherein the plurality of side walls, the plurality of upper walls, and the plurality of lower walls define an inner space through which a fluid can flow via the plurality of apertures, wherein a portion of at least one of the plurality of upper walls contacts a respective side surface of the semiconductor chip, and wherein a portion of at least one of the plurality of lower walls contacts a respective side surface of the semiconductor chip.

20. The chip protection device of claim 19, wherein the plurality of apertures each have a same shape, wherein each of the plurality of upper walls are coplanar with an upper surface of the semiconductor chip, and wherein each of the plurality of apertures has a circular or rectangular shape.

* * * * *